(12) United States Patent
Wang

(10) Patent No.: US 12,052,931 B2
(45) Date of Patent: Jul. 30, 2024

(54) SEMICONDUCTOR DEVICE

(71) Applicant: UNITED MICROELECTRONICS CORP., Hsin-Chu (TW)

(72) Inventor: Hui-Lin Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 91 days.

(21) Appl. No.: 18/079,890

(22) Filed: Dec. 13, 2022

(65) Prior Publication Data

US 2023/0110380 A1   Apr. 13, 2023

Related U.S. Application Data

(63) Continuation of application No. 17/082,043, filed on Oct. 28, 2020, now Pat. No. 11,557,718.

(30) Foreign Application Priority Data

Oct. 12, 2020  (CN) .......................... 202011082925.7

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00; H01L 21/3212
See application file for complete search history.

(56) References Cited

U.S. PATENT DOCUMENTS

| 2019/0027679 A1 | 1/2019 | Ouellette | |
| 2019/0140018 A1* | 5/2019 | Kalnitsky | ............. G11C 11/161 |
| 2020/0274066 A1 | 8/2020 | Dutta | |
| 2022/0036932 A1 | 2/2022 | Chuang | |

* cited by examiner

*Primary Examiner* — Shih Tsun A Chou
(74) *Attorney, Agent, or Firm* — Winston Hsu

(57) ABSTRACT

A semiconductor device includes a storage element on a substrate. The storage element has a tapered upper end structure. The tapered upper end structure includes a top electrode and a spacer surrounding the top electrode. A gap-fill dielectric layer is disposed around the spacer. A conductive cap layer covers the top electrode and the spacer. An inter-metal dielectric (IMD) layer is disposed on the conductive cap layer. A metal interconnection is disposed in the IMD layer and electrically connected to the top electrode through the conductive cap layer.

12 Claims, 11 Drawing Sheets

SEMICONDUCTOR DEVICE

CROSS REFERENCE TO RELATED APPLICATIONS

This application is a continuation application of U.S. application Ser. No. 17/082,043, filed on Oct. 28, 2020. The content of the application is incorporated herein by reference.

BACKGROUND OF THE INVENTION

1. Field of the Invention

The present invention relates to a semiconductor device, in particular to a magnetic random access memory (MRAM) device and a manufacturing method thereof.

2. Description of the Prior Art

Magnetic random access memory (MRAM) devices are regarded as the next generation memory technology because of their fast read and write speed, non-volatile nature, and easy integration with semiconductor manufacturing processes.

FIG. 1 is a schematic cross-sectional view of a magnetic memory device manufactured according to the prior art. As shown in FIG. 1, after the storage element MC in the memory cell region CR is fabricated on the substrate 100P, an ultra-low dielectric constant (ULK) dielectric layer 130P is deposited in a blanket manner, and then the ULK dielectric layer 130P is planarized. A nitrogen-doped carbide (NDC) layer 134P and a ULK dielectric layer 140P are sequentially deposited on the substrate 100P. Then, a metallization process is performed in the ULK dielectric layer 140P and the NDC layer 134P to form a wire IM and a via VM in the memory cell region CR, and a wire IL and a via VL in the logic region LR.

In the process of forming the via VM in the memory cell region CR, it is necessary to etch through the NDC layer 134P and the ULK dielectric layer 130P above the storage element MC such that the via VM can be electrically connected to the top electrode layer TE of the storage element MC. After etching through the NDC layer 134P, the etching rate suddenly increases, resulting in a negative slope profile NSP on the sidewall of the via VM, which results in poor coverage during subsequent deposition of the tantalum/tantalum nitride barrier layer, and even produce defects such as Cu void. In addition, when planarizing the ULK layer 130P, a predetermined thickness (for example, about 300 angstroms) of the ULK dielectric layer 130P needs to be maintained above the storage element MC, which makes the chemical mechanical polishing process difficult to control.

Therefore, there is still a need for an improved MRAM device and its manufacturing method in this technical field to solve the above-mentioned shortcomings of the prior art.

SUMMARY OF THE INVENTION

One object of the present invention is to provide an improved semiconductor device and its manufacturing method to solve the deficiencies or shortcomings of the prior art.

One aspect of the invention provides a semiconductor device including a storage element on a substrate. The storage element includes a tapered upper end structure. The tapered upper end structure includes a top electrode and a spacer surrounding the top electrode. A gap-fill dielectric layer is disposed around the spacer. A conductive cap layer covers the top electrode and the spacer. An inter-metal dielectric (IMD) layer is disposed on the conductive cap layer. A metal interconnection is disposed in the IMD layer and electrically connected to the top electrode through the conductive cap layer.

According to some embodiments, the storage element includes a magnetic tunnel junction (MTJ) under the top electrode.

According to some embodiments, the MTJ includes a magnetic reference layer on a bottom electrode layer, a tunnel barrier layer on the magnetic reference layer, a magnetic free layer on the tunnel barrier layer, and a capping layer on the magnetic free layer.

According to some embodiments, the top electrode includes tantalum.

According to some embodiments, the spacer is in direct contact with a sidewall of the top electrode.

According to some embodiments, the spacer includes silicon nitride.

According to some embodiments, the gap-fill dielectric layer includes a silicon oxide layer.

According to some embodiments, the gap-fill dielectric layer includes a recessed top surface that is lower than a bottom surface of the top electrode.

According to some embodiments, the conductive cap layer includes Ti, TiN, Ta or TaN.

According to some embodiments, the conductive cap layer is in direct contact with the top electrode and the spacer.

According to some embodiments, the metal interconnection includes a copper damascene structure.

According to some embodiments, the metal interconnection includes a downward tooth around the top electrode and the spacer.

Another aspect of the invention provides a semiconductor device including a substrate comprising a cell region and a logic region thereon, a first inter-metal dielectric (IMD) layer disposed on the substrate and covering the cell region and the logic region, and a storage element disposed on the first IMD layer within the cell region. The storage element includes a tapered upper end structure. The tapered upper end structure includes a top electrode and a spacer surrounding the top electrode. A gap-fill dielectric layer is disposed around the spacer. A conductive cap layer covers the top electrode and the spacer. The conductive cap layer extends to a sidewall surface of the gap-fill dielectric layer at an interface between a cell region and a logic region. The conductive cap layer extends to a sidewall surface of the gap-fill dielectric layer at an interface between the cell region and the logic region. A second inter-metal dielectric (IMD) layer is disposed on the conductive cap layer and the first IMD layer. A metal interconnection is disposed in the second IMD layer and electrically connected to the top electrode through the conductive cap layer.

According to some embodiments, the conductive cap layer does not cover a top surface of the first IMD layer within the logic region.

According to some embodiments, the conductive cap layer includes Ti, TiN, Ta or TaN.

According to some embodiments, the conductive cap layer is in direct contact with the top electrode and the spacer.

According to some embodiments, the metal interconnection includes a copper damascene structure.

According to some embodiments, the metal interconnection includes a downward tooth around the top electrode and the spacer.

According to some embodiments, the storage element includes a magnetic tunnel junction (MTJ) under the top electrode.

According to some embodiments, the MTJ includes a magnetic reference layer on a bottom electrode layer, a tunnel barrier layer on the magnetic reference layer, a magnetic free layer on the tunnel barrier layer, and a capping layer on the magnetic free layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 11 are schematic diagrams showing a method of fabricating a semiconductor device according to an embodiment of the present invention, in which, FIG. 2 illustrates a top view of the semiconductor device after the magnetic tunnel junction structure is formed and the silicon nitride cap layer is deposited in a blanket manner;

FIG. 3 to FIG. 6 are schematic cross-sectional views taken along line I-I' in FIG. 2;

FIG. 7 illustrates a top view of the semiconductor device after a patterned photoresist is formed on the conductive cap layer;

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
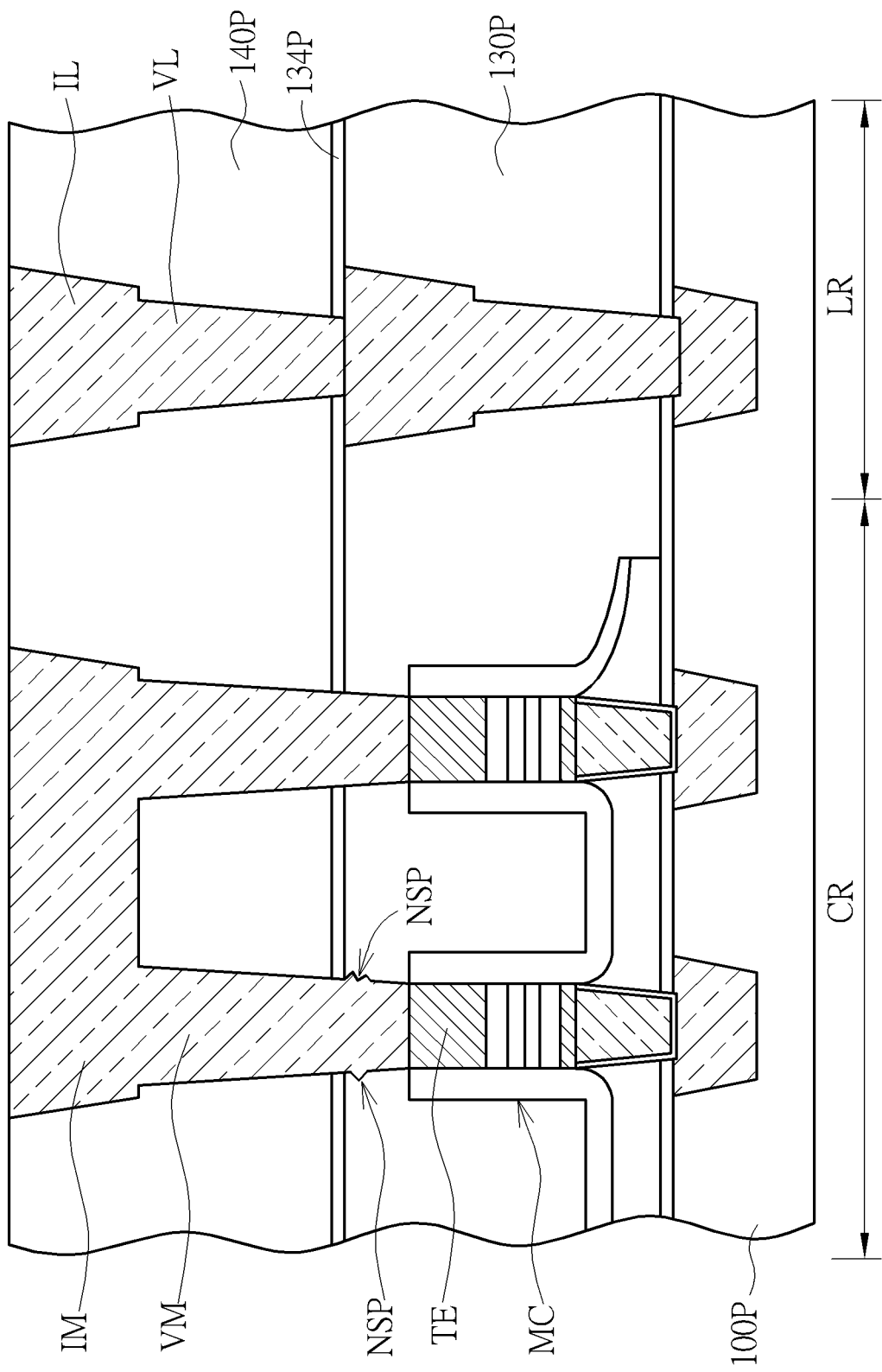
FIG. 1 is a schematic cross-sectional view of a magnetic memory device manufactured according to the prior art.
Figure 2:
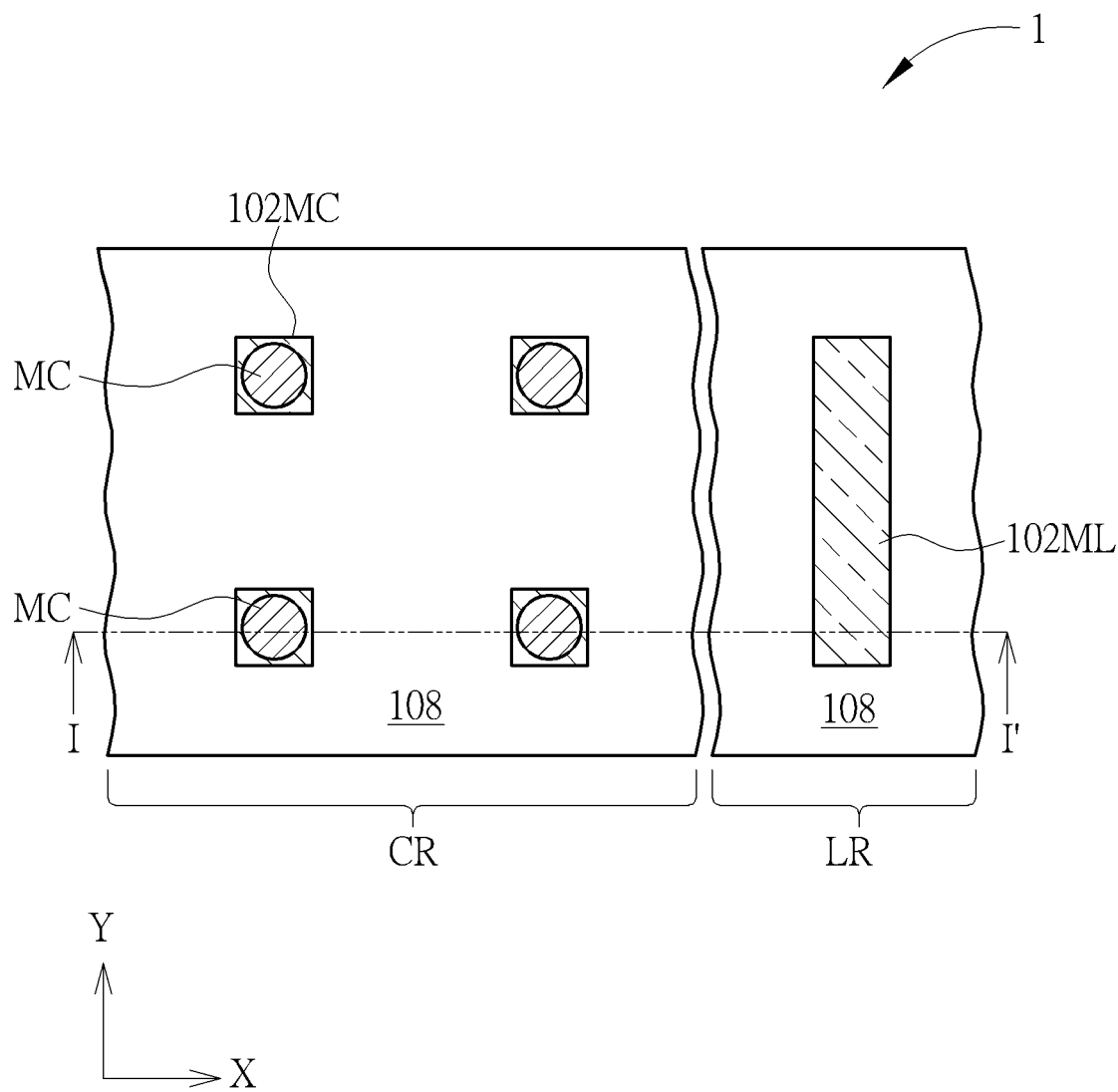
Figure 5:
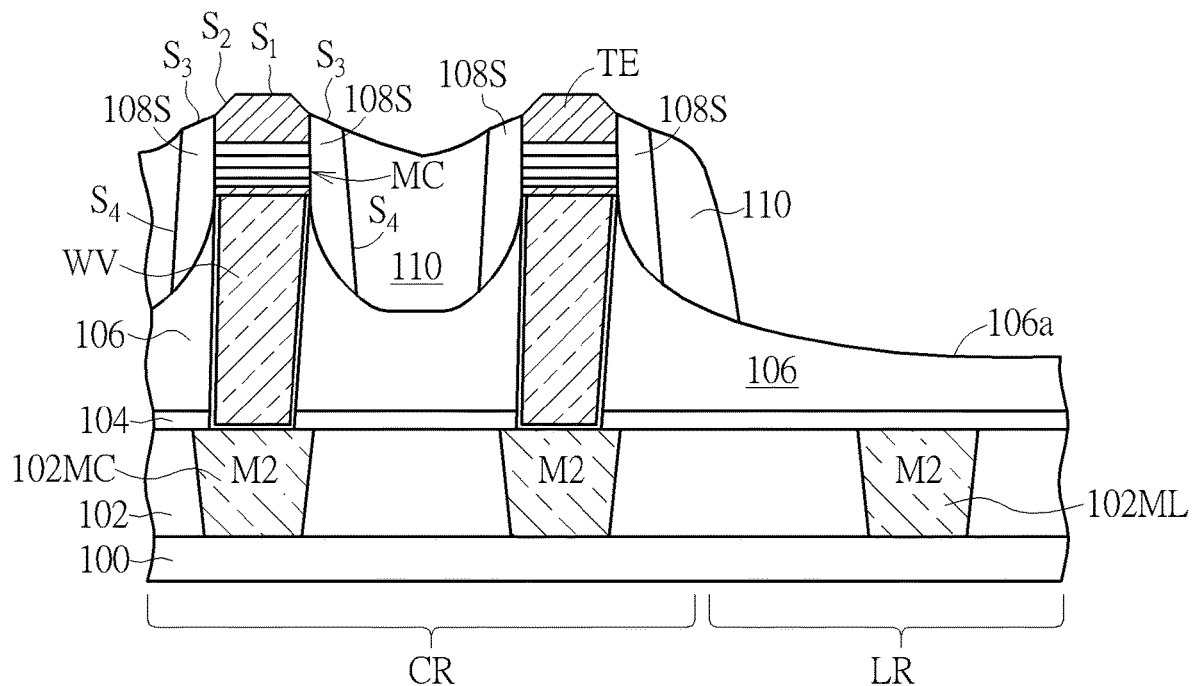
Figure 6:
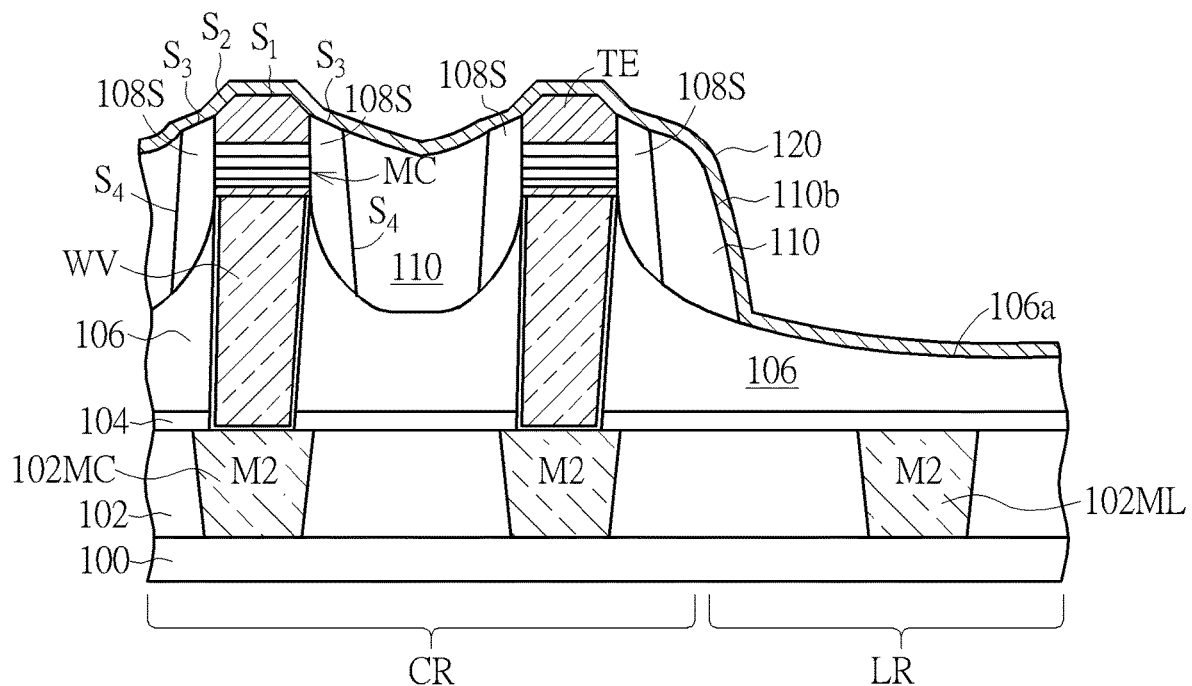
Figure 7:
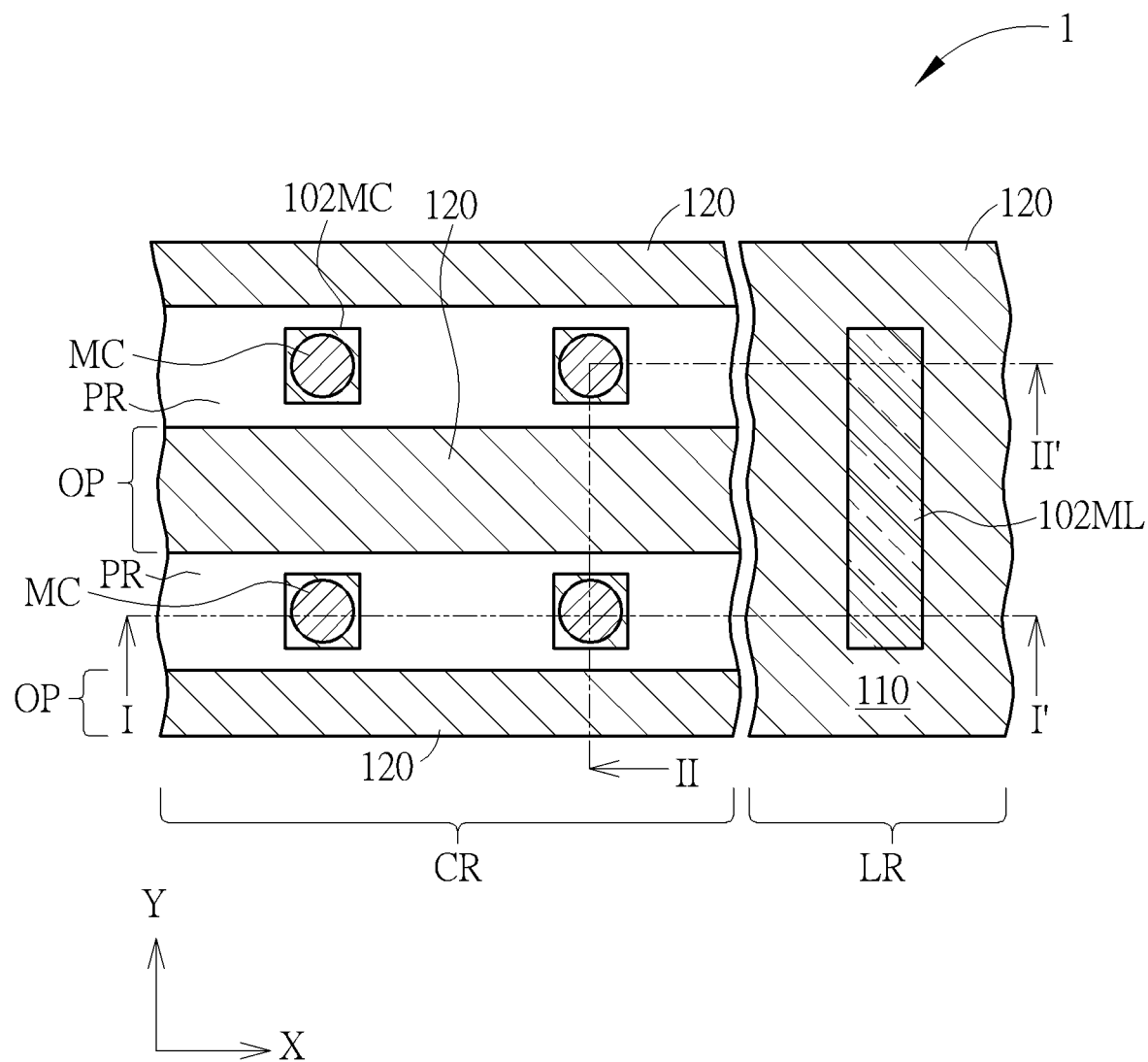

Please refer to FIG. 2 to FIG. 11, which are schematic diagrams showing a method of fabricating a semiconductor device 1 according to an embodiment of the present invention. FIG. 2 illustrates a top view of the semiconductor device 1 after the magnetic tunnel junction structure is formed and the silicon nitride cap layer is deposited in a blanket manner. FIG. 3 to FIG. 6 are schematic cross-sectional views taken along line I-I' in FIG. 2. FIG. 7 illustrates a top view of the semiconductor device 1 after a patterned photoresist is formed on the conductive cap layer. FIGS. 7A, 8A, 9A, 10A, and 11A are schematic cross-sectional views taken along line I-I' in FIG. 7. FIGS. 7B, 8B, 9B, 10B; and 11B are schematic cross-sectional views taken along line II-II' in FIG. 7.

Figure 3:
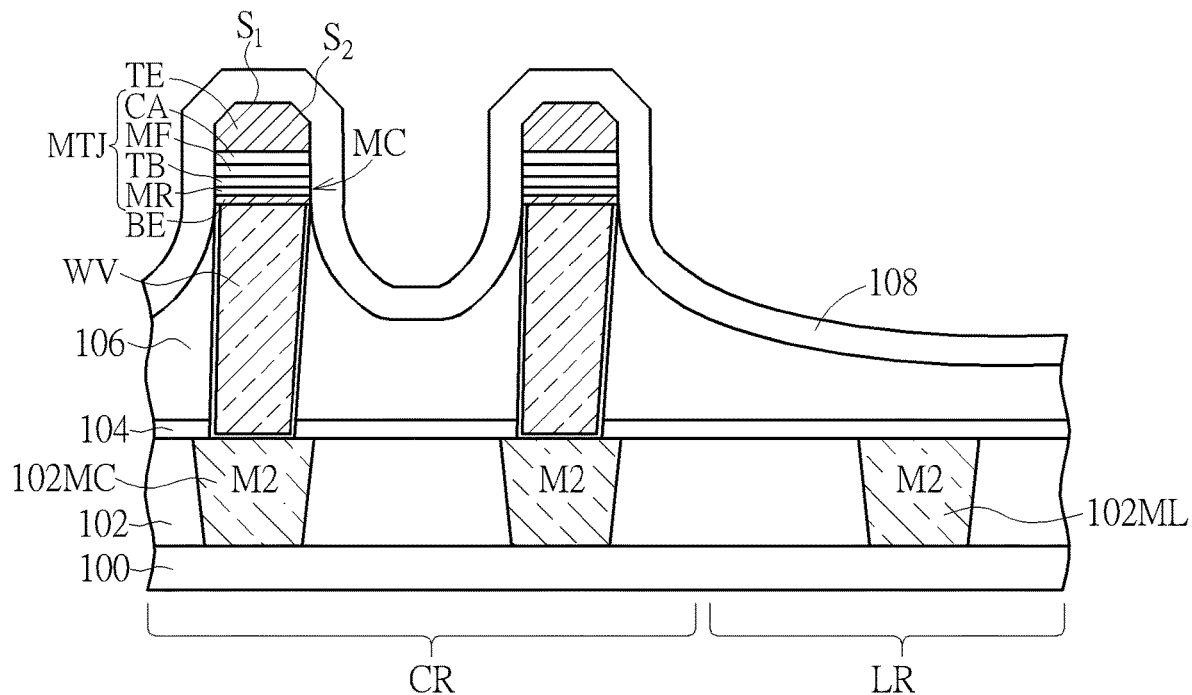

As shown in FIG. 2 and FIG. 3, the substrate 100 includes a memory cell region (or cell region) CR and a logic region LR. A plurality of storage elements MC are formed in the memory cell region CR and are arranged in an array. For the sake of simplicity, only a 2×2 array is shown in FIG. 2. According to an embodiment of the present invention, the substrate 100 may include a silicon substrate, but is not limited thereto. At least one dielectric layer 102 is formed on the substrate 100, for example, an ultra-low k (ULK) dielectric layer. For example, the k value of the dielectric layer 102 may be less than 2.8. A nitrogen-doped carbide (NDC) layer 104 and an inter-metal dielectric (IMD) layer 106, such as a silicon oxide layer, are provided on the dielectric layer 102 to cover the memory cell region CR and the logic region LR. In the dielectric layer 102 in the memory cell region CR and the logic region LR, lower metal interconnections 102MC and 102ML are respectively provided. According to an embodiment of the present invention, the lower metal interconnections 102MC and 102ML may be located in the second metal interconnection layer M2, but are not limited thereto.

According to an embodiment of the present invention, each storage element MC in the memory cell region CR is disposed on the IMD layer 106, and is electrically connected to the lower metal interconnect 102MC through the tungsten plug WV formed in the IMD layer 106 and the NDC layer 104.

According to an embodiment of the present invention, for example, each memory element MC may include a bottom electrode layer BE disposed on the tungsten plug WV, a magnetic tunnel junction structure MTJ disposed on the bottom electrode BE, and a top electrode layer TE disposed on the magnetic tunnel junction structure MTJ. According to an embodiment of the present invention, the magnetic tunnel junction structure MTJ may include a magnetic reference layer MR disposed on the bottom electrode layer BE, a tunnel barrier layer TB disposed on the magnetic reference layer MR, a magnetic free layer MF disposed on the tunnel barrier layer TB, and a capping layer CA disposed on the magnetic free layer MF, but it is not limited thereto.

According to the embodiment of the present invention, the magnetic reference layer MR, the tunnel barrier layer TB, the magnetic free layer MF, and the capping layer CA may be any suitable materials known in the art, and may be a single layer or multiple layers. For example, the magnetic reference layer MR may include an antiferromagnetic layer such as PtMn, and includes one or more magnetic material layers of CoFe, NiFe, CoFeB, Ru, or other materials or a combination thereof disposed on the antiferromagnetic layer, but not limited to this. The magnetic free layer MF may include one or more magnetic material layers, and the one or more magnetic material layers may include CoFe, NiFe, CoFeB, other magnetic material layers, or a combination thereof. The tunnel barrier layer TB may include a thin insulator such as $Al_2O_3$ or a semiconductor material.

According to an embodiment of the present invention, for example, the bottom electrode layer BE may include a tantalum nitride (TaN) layer. According to an embodiment of the present invention, for example, the thickness of the bottom electrode layer BE may be between 100 and 200 angstroms, for example, about 170 angstroms, but is not limited thereto. According to an embodiment, for example, the top electrode layer TE may include a tantalum (Ta) layer having a thickness of about 600 angstroms, but is not limited thereto.

According to the embodiment of the present invention, the storage element MC is defined by an ion beam etching (IBE) process. After the IBE process is completed, the storage element MC may include a tapered upper end structure. For example, the top electrode layer TE may include a flat upper surface $S_1$ and a surrounding inclined surface $S_2$. Then, a chemical vapor deposition (CVD) process may be performed to deposit a silicon nitride cap layer 108 on the substrate 100 in a blanket manner.

Figure 4:
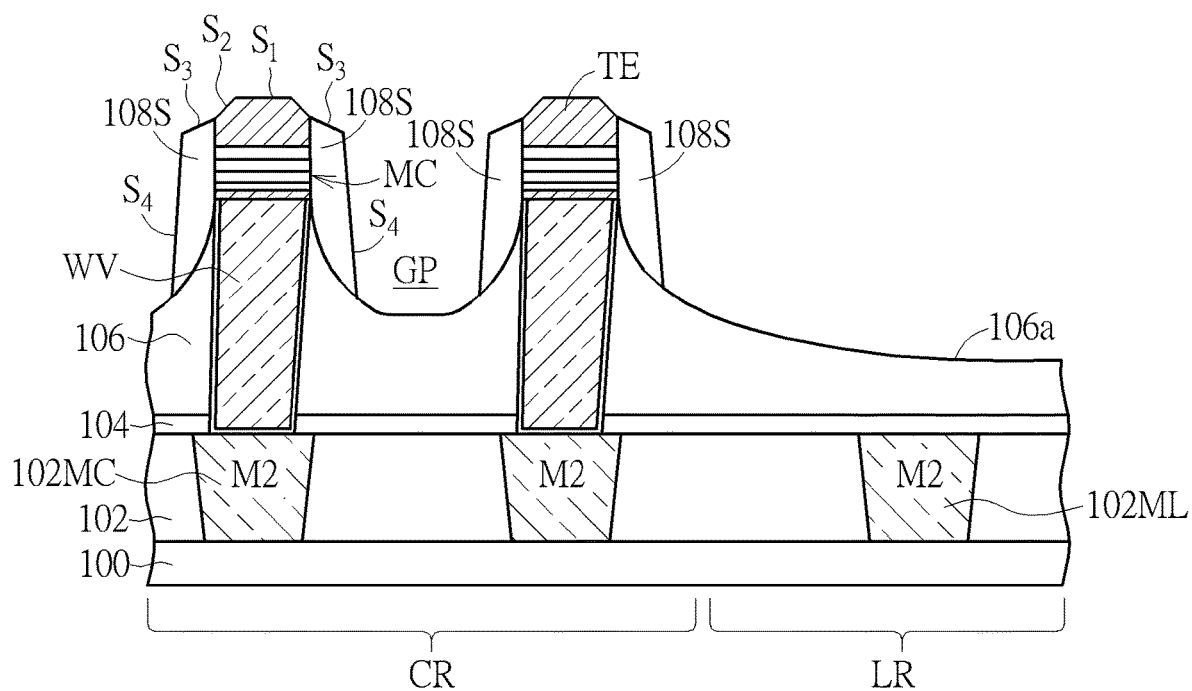

As shown in FIG. 4, an anisotropic dry etching process is then performed to etch the silicon nitride cap layer 108 until the IMD layer 106 is exposed, thereby forming a spacer 108S covering the sidewalls of the storage element MC. According to an embodiment of the present invention, the spacer 108S surrounds the top electrode layer TE. According to an embodiment of the present invention, the spacer 108S is in direct contact with a sidewall of the top electrode layer TE. The tapered upper end structure of the storage element MC may include the spacer 108S.

According to an embodiment of the present invention, the spacer 108S has an inclined top surface $S_3$, which is connected upward to the inclined surface $S_2$ of the top electrode layer TE. According to an embodiment of the present invention, the inclined top surface $S_3$ of the spacer 108S is lower than the inclined surface $S_2$ of the top electrode layer TE. According to an embodiment of the present invention, the spacer 108S includes a nearly vertical sidewall $S_4$ between the inclined top surface $S_3$ and the upper surface 106a of the IMD layer 106. According to an embodiment of the present invention, there is a gap GP between the sidewalls $S_4$ and the upper surface 106a of the IMD layer 106.

As shown in FIG. 5, another CVD process is then performed to deposit a gap-fill dielectric layer 110, such as a silicon oxide layer, on the substrate 100, but not limited thereto. Then, an etch-back process is performed to etch the gap filling dielectric layer 110 until the flat upper surface $S_1$ and the inclined surface $S_2$ of the top electrode layer TE, the inclined top surface $S_3$ of the spacer 108S, and the upper surface 106a of the IMD layer 106 in the logic region LR are exposed. After the etch-back process is completed, the remaining gap-fill dielectric layer 110 fills the gap GP between the sidewalls $S_4$ and the upper surface 106a of the IMD layer 106. According to an embodiment of the present invention, at this point, the gap-fill dielectric layer 110 includes a recessed top surface 110a, wherein the lowest point of the recessed top surface 110a is lower than a bottom surface $S_5$ of the top electrode layer TE (or the interface between the top electrode layer TE and the capping layer CA).

As shown in FIG. 6, a conductive cap layer 120 is then deposited in a blanket manner. For example, the conductive cap layer 120 may include titanium (Ti), titanium nitride (TiN), tantalum (Ta), or tantalum nitride (TaN), but not limited thereto. According to an embodiment of the present invention, the conductive cap layer 120 covers and directly contacts the flat upper surface $S_1$ and the inclined surface $S_2$ of the exposed top electrode layer TE, the inclined top surface $S_3$ of the spacer 108S, the recessed top surface 110a of the gap-fill dielectric layer 110, and the upper surface 106a of the IMD layer 106 in the logic region LR. According to an embodiment of the present invention, the conductive cap layer 120 covers and is in direct contact with a sidewall surface 110b of the gap-fill dielectric layer 110 at the interface between the memory cell region CR and the logic region LR.

Figure 7A:
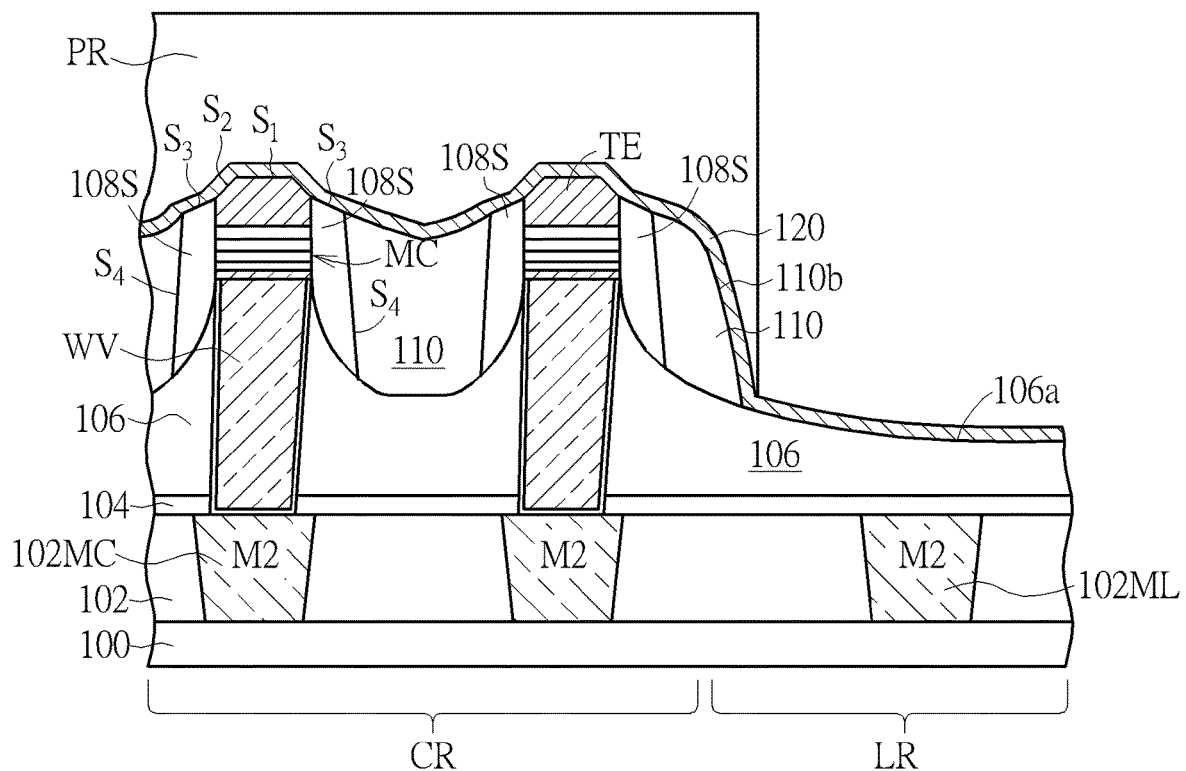
FIGS. 7A, 8A, 9A, 10A, and 11A are schematic cross-sectional views taken along line I-I' in FIG. 7, and FIGS. 7B, 8B, 9B, 10B; and 11B are schematic cross-sectional views taken along line II-II' in FIG. 7.
Figure 7B:
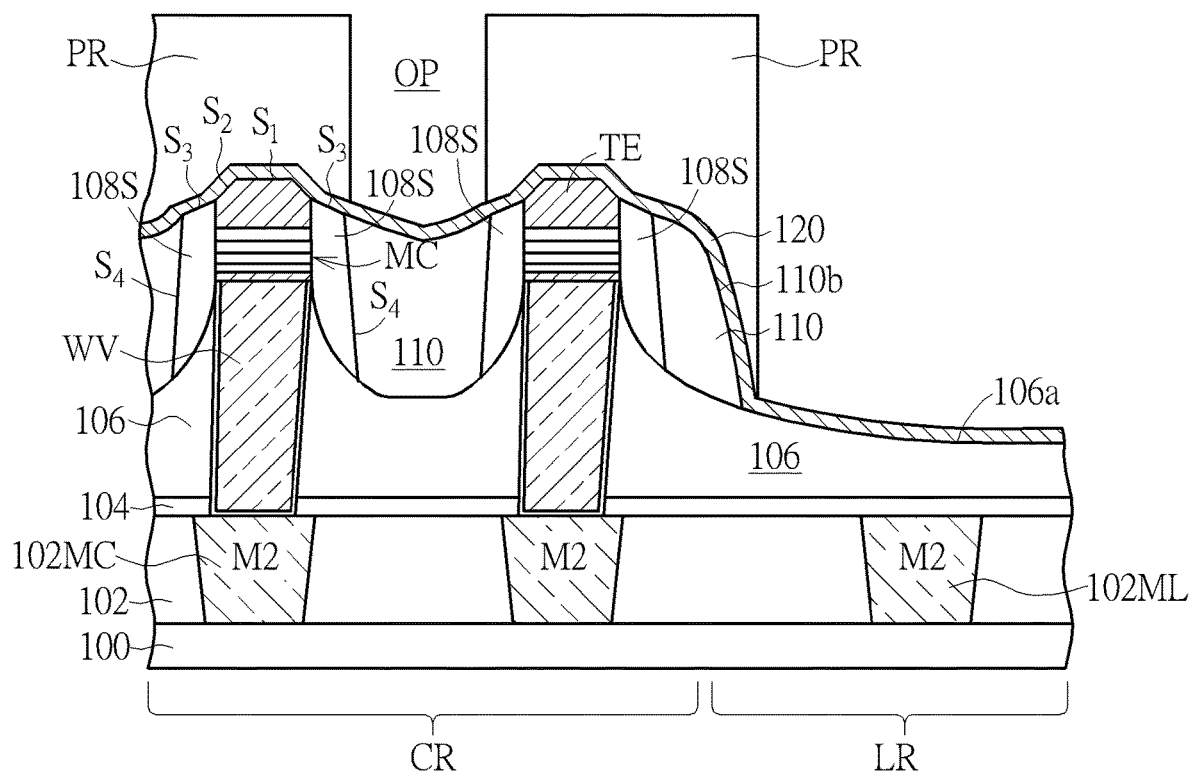

As shown in FIG. 7, FIG. 7A and FIG. 7B, a patterned photoresist PR is then formed on the conductive cap layer 120. According to an embodiment of the present invention, the patterned photoresist PR covers the storage elements MC arranged along each row in the X direction. According to an embodiment of the present invention, the patterned photoresist PR has an opening OP extending along the X direction. According to an embodiment of the present invention, the patterned photoresist PR does not cover the conductive cap layer 120 in the logic region LR.

Figure 8A:
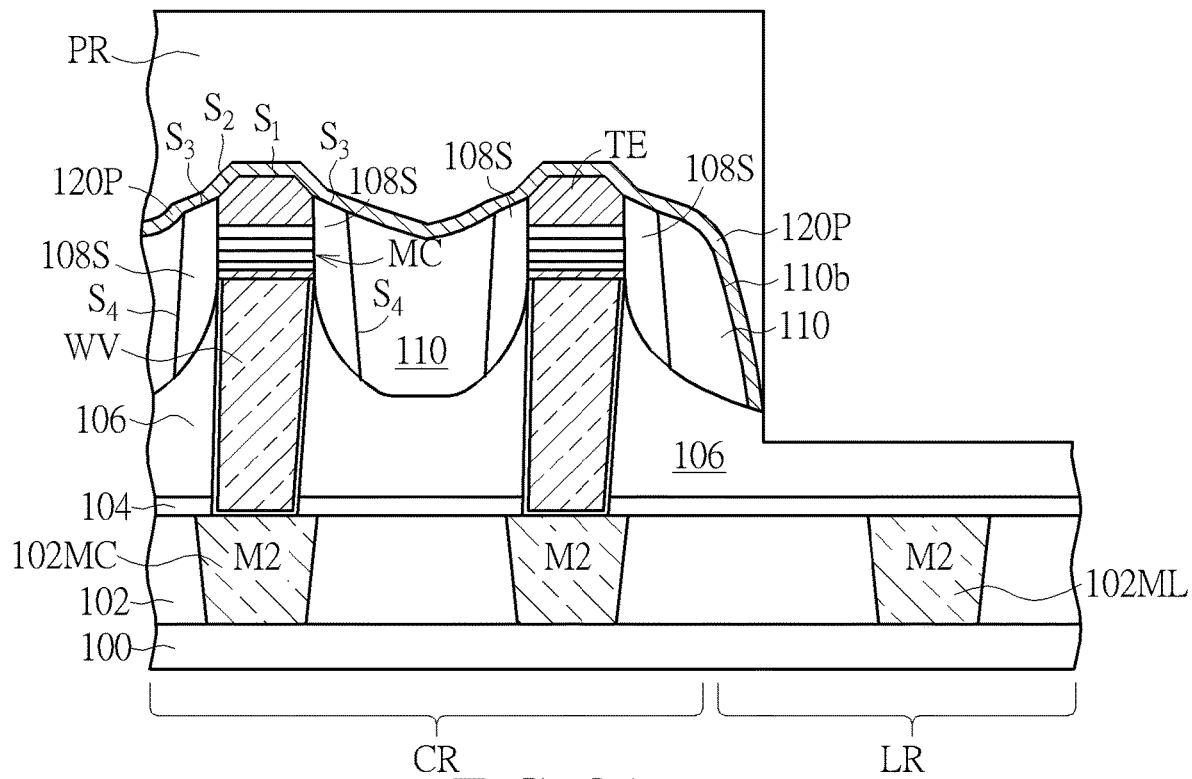
Figure 8B:
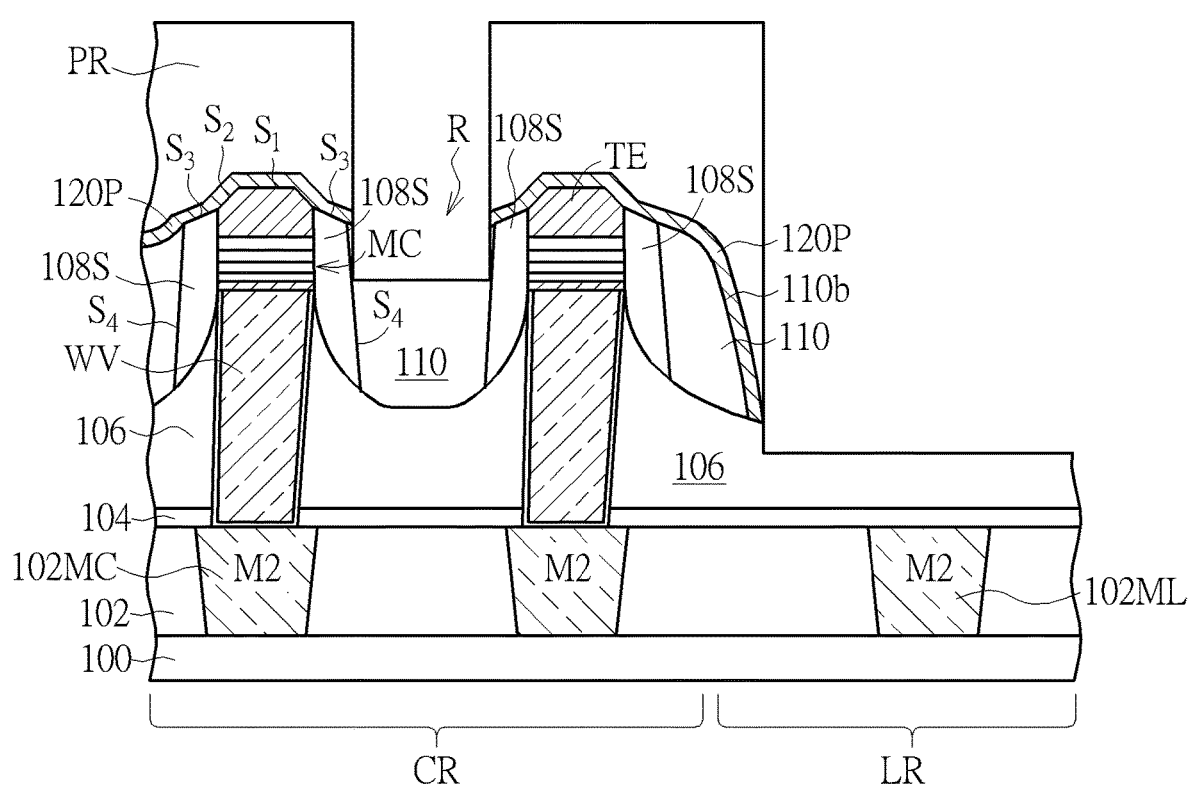

As shown in FIG. 8A and FIG. 8B, an etching process is then performed to remove the conductive cap layer 120 that is not covered by the patterned photoresist PR. According to an embodiment of the present invention, the etching process may include an anisotropic dry etching process, but is not limited thereto. According to an embodiment of the present invention, the conductive cap layer 120 and a part of the IMD layer 106 in the logic region LR can be removed. According to an embodiment of the present invention, in the memory cell region CR, a part of the gap-fill dielectric layer 110 may be removed to form a recessed trench R, thereby forming a patterned conductive cap layer 120P.

Figure 9A:
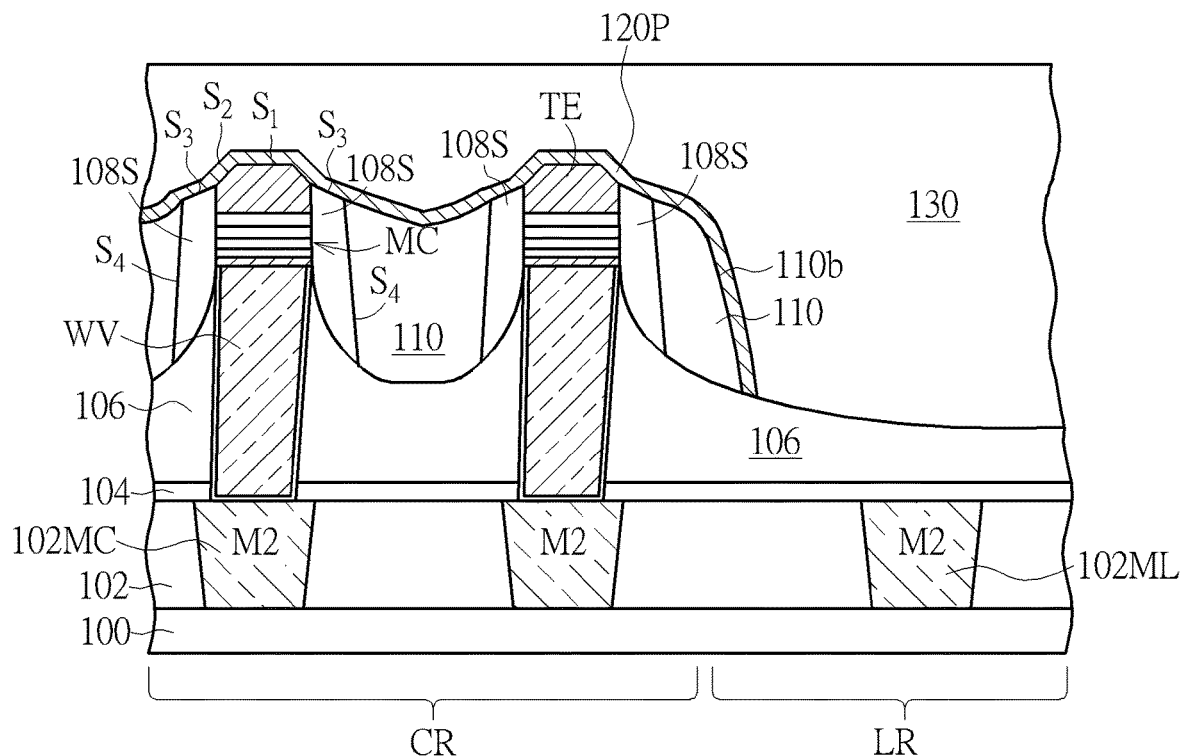
Figure 9B:
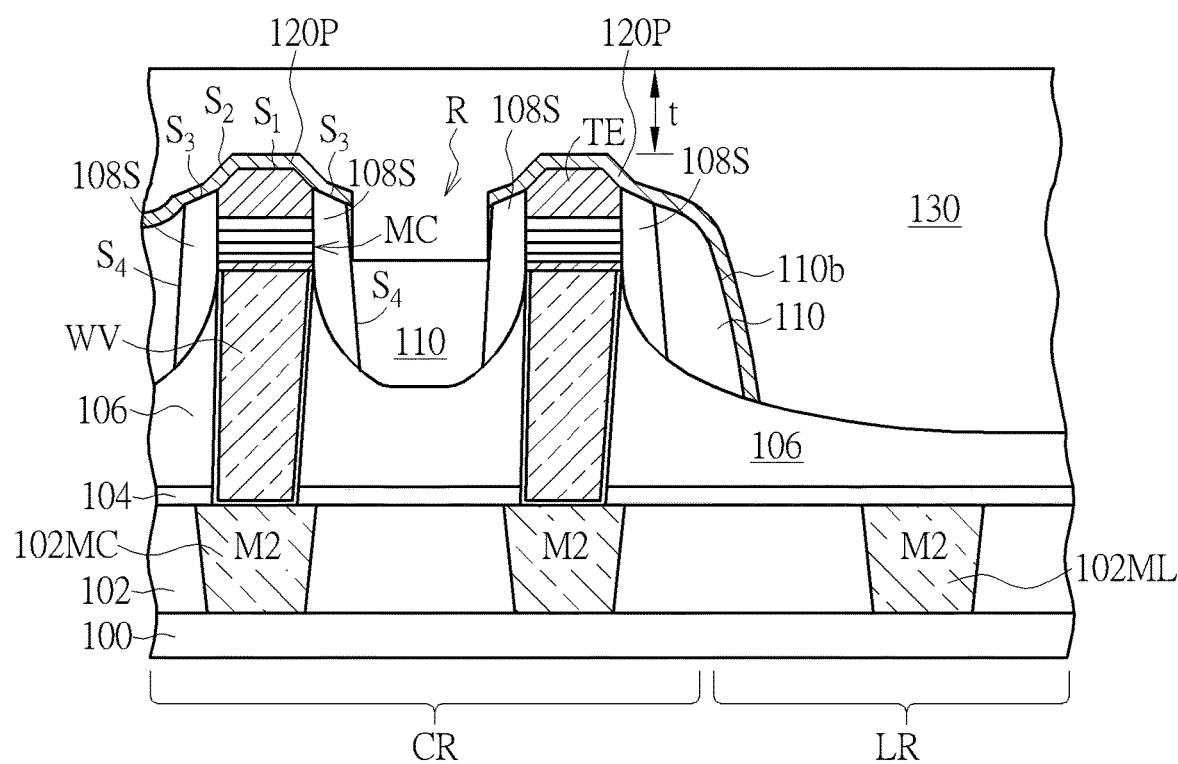

As shown in FIG. 9A and FIG. 9B, the remaining patterned photoresist PR is then removed. A CVD process is then performed to deposit an IMD layer 130 on the substrate 100 in a blanket manner. According to an embodiment of the present invention, the IMD layer 130 may be an ULK dielectric layer. According to an embodiment of the present invention, the IMD layer 130 covers and is in direct contact with the patterned conductive cap layer 120P, the gap-fill dielectric layer 110 between the patterned conductive cap layers 120P, and the IMD layer 106 in the logic region LR. According to an embodiment of the present invention, the IMD layer 130 fills the recessed trench R. According to an embodiment of the present invention, the thickness t of the IMD layer 130 directly above the patterned conductive cap layer 120P may be about 2000-5000 angstroms. Subsequently, the IMD layer 130 is subjected to a planarization process.

Figure 10A:
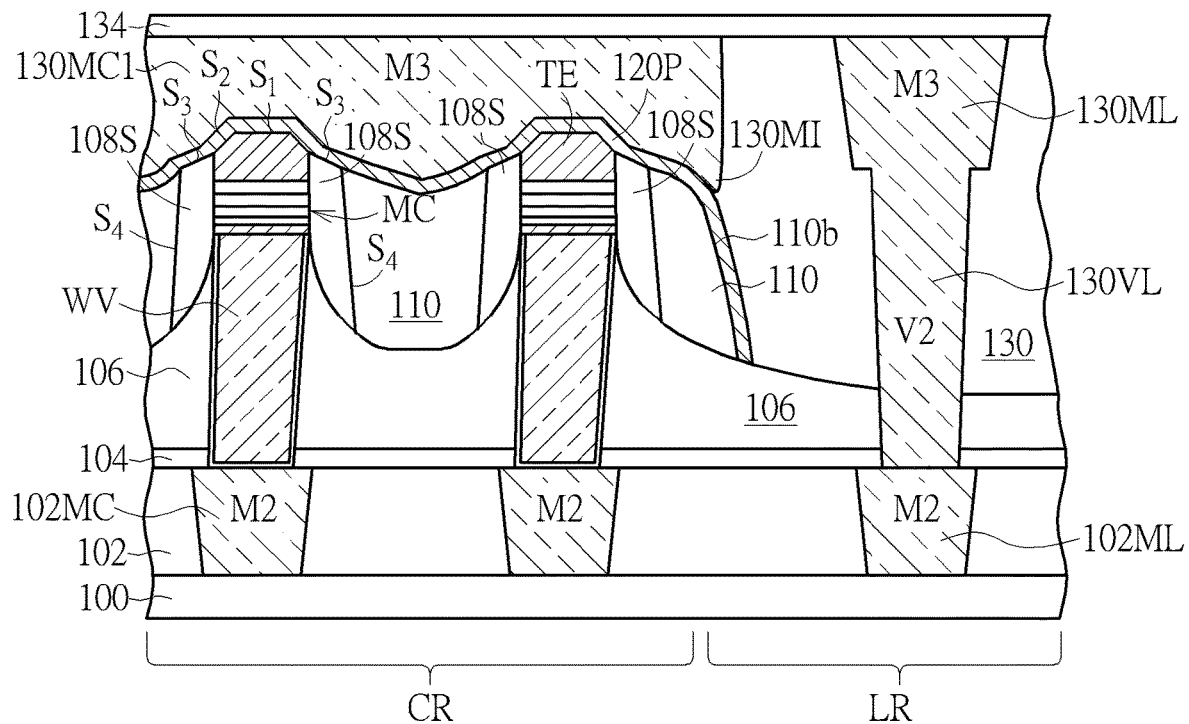
Figure 10B:
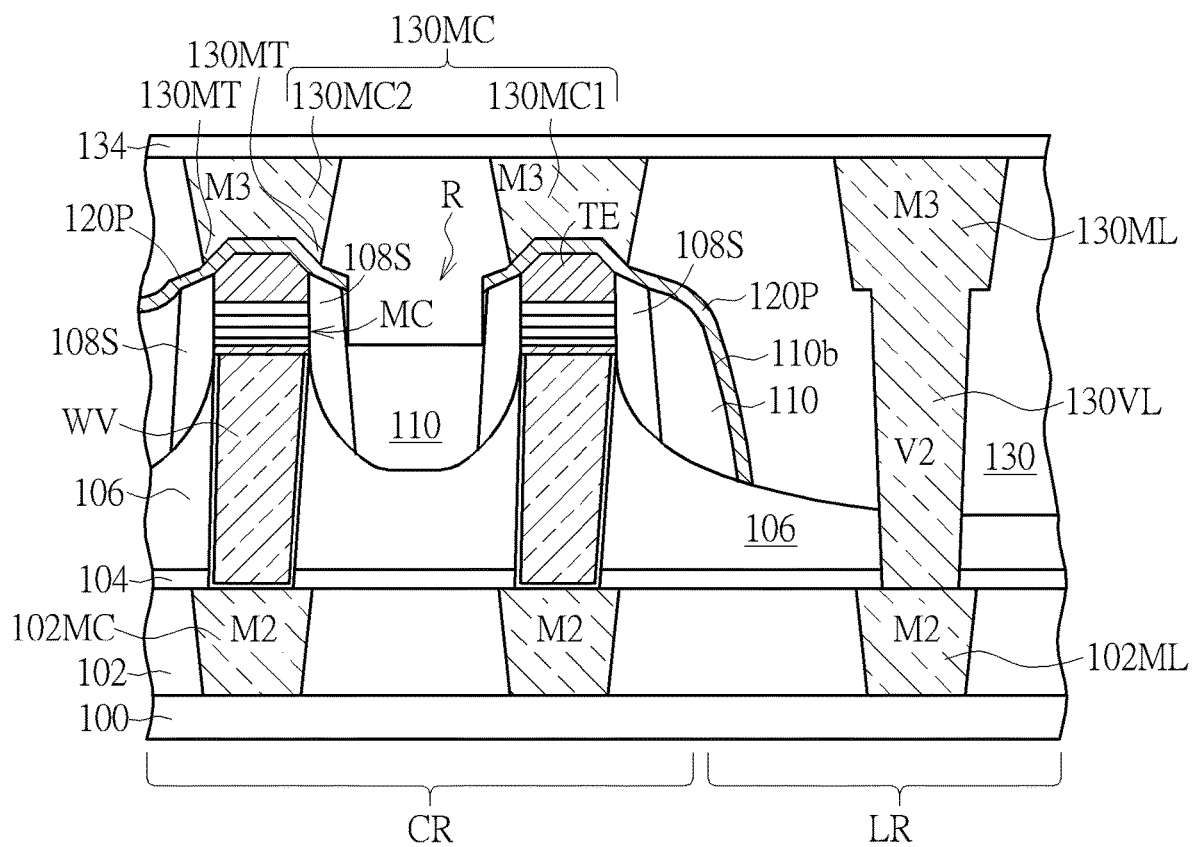

As shown in FIG. 10A and FIG. 10B, a metallization process is then performed to form metal interconnections 130MC and 130ML in the IMD layer 130. The metal interconnections 130MC and 130ML may be located in the third metal interconnection layer M3, but are not limited thereto. The metal interconnection 130MC is formed in the memory cell region CR, and is electrically connected to the top electrode layer TE of each storage element MC through the patterned conductive cap layer 120P. It can be seen from FIG. 10A and FIG. 10B that the metal interconnection 130MC includes a plurality of parallel metal interconnections 130MC1 and 130MC2 extending along the X direction. In the logic region LR, the metal interconnection 130ML is electrically connected to the lower metal interconnection 102ML through the conductive via 130VL. The conductive via 130VL may be a second layer via V2 in the metal interconnect structure.

According to an embodiment of the present invention, the metal interconnections 130MC and 130ML may include a copper damascene structure. In addition, the metal interconnection 130MC includes a downward tooth structure 130MT surrounding the top electrode layer TE and the spacer 108S. At the interface between the memory cell area CR and the logic area LR, a downward tooth structure 130MI can also be observed. After the metal interconnections 130MC and 130ML are completed, a nitrogen-doped carbide (NDC) layer 134 may be deposited on the metal interconnections 130MC and 130ML and on the IMD layer 130.

Figure 11A:
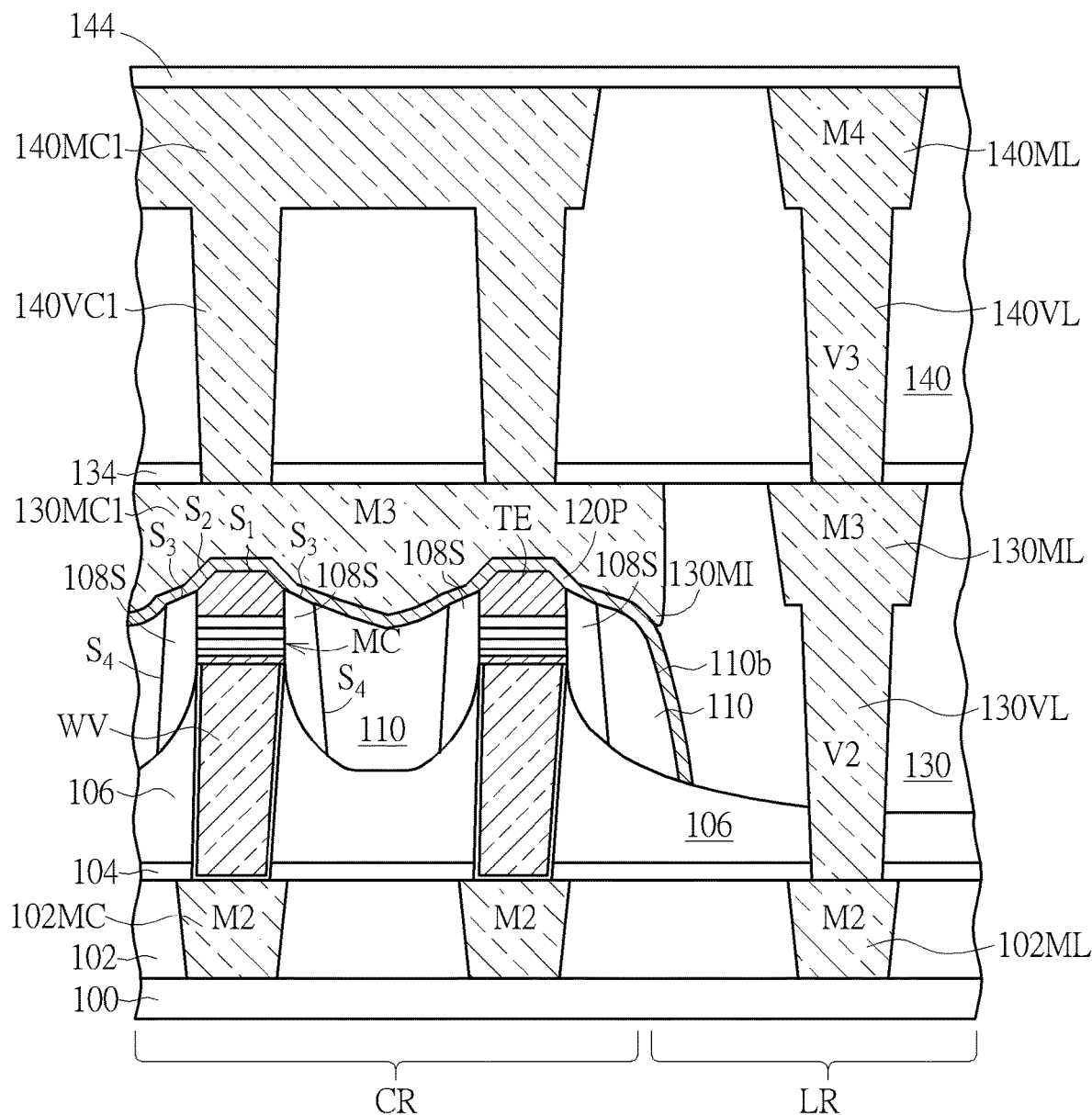
Figure 11B:
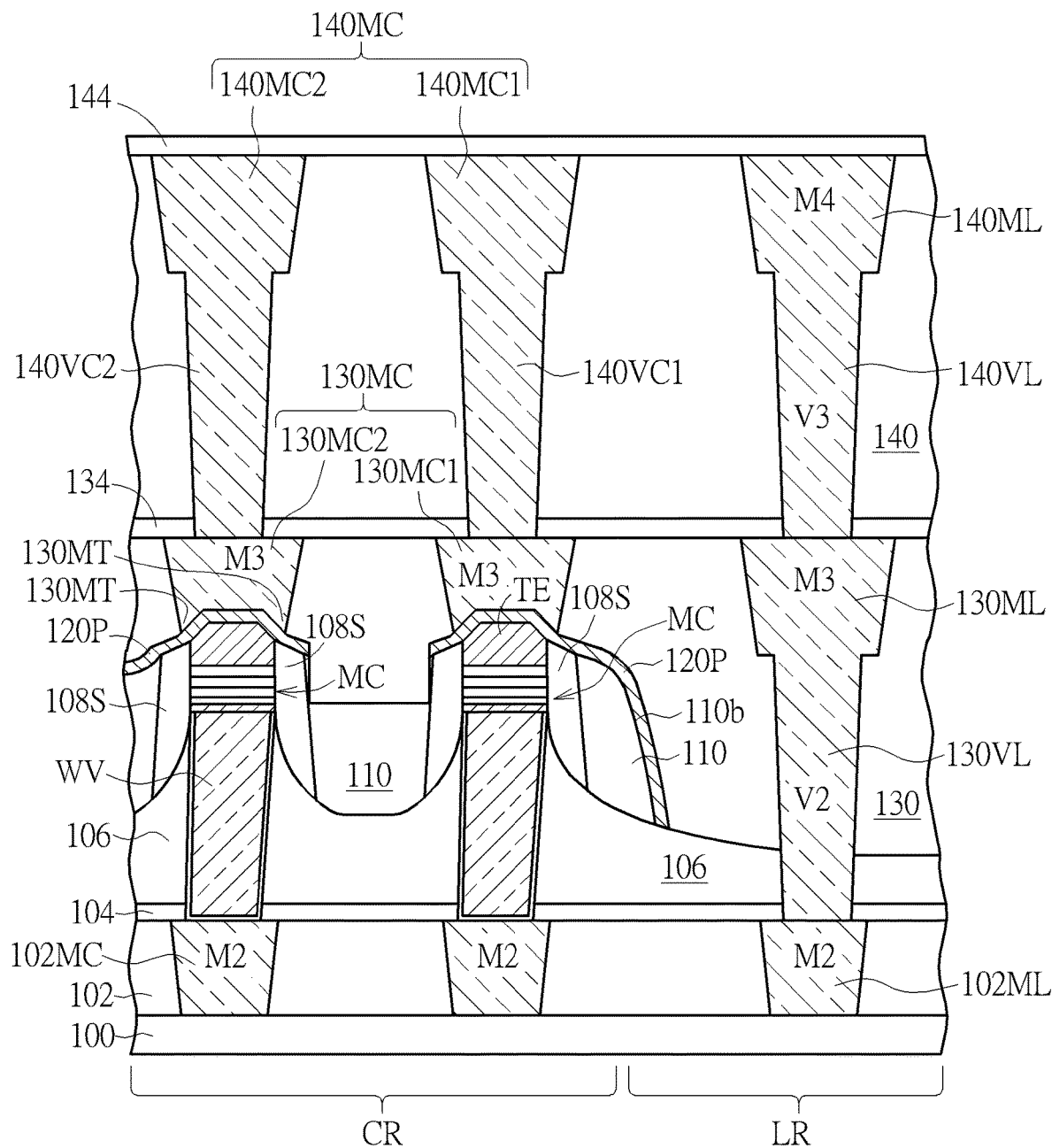

As shown in FIG. 11A and FIG. 11B, an inter-metal dielectric (IMD) layer 140 is then deposited in a blanket manner According to an embodiment of the present invention, the IMD layer 140 may be an ultra-low-k dielectric layer. Then, the metallization process is continued to form metal interconnections 140MC and 140ML in the IMD layer 140. The metal interconnections 140MC and 140ML may be located in the fourth metal interconnection layer M4, but are not limited thereto. As can be seen from FIG. 11A and FIG. 11B, the metal interconnect 140MC includes a plurality of parallel metal interconnections 140MC1 and 140MC2, extending along the X direction, which are electrically connected to the underlying metal interconnections 130MC1 and 130MC2 through the conductive vias 140VC1 and 140VC2. In the logic region LR, the metal interconnection 140ML is electrically connected to the metal interconnection 130ML through the conductive via 140VL. The conductive vias 140VC1, 140VC2, and 140VL may belong to the third layer via V3 in the metal interconnect structure. Finally, a nitrogen-doped carbide (NDC) layer 144 can be deposited on the metal interconnections 140MC and 140ML and on the IMD layer 140.

The advantages of the present invention include at least: (1) it can avoid the control problem when planarizing the ULK layer; and (2) by introducing a conductive cap layer, and forming metal interconnections 130MC and 130ML in the IMD layer 130, the problem of negative slope profile on the sidewall of the through hole when the through hole is formed can be avoided, and the defects such as copper holes can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a storage element on a substrate, wherein the storage element comprises a tapered upper end structure, wherein the tapered upper end structure comprises a top electrode and a spacer surrounding the top electrode;
    a gap-fill dielectric layer around the spacer;
    a conductive cap layer covering the top electrode and the spacer, wherein the conductive cap layer extends to a sidewall surface of the gap-fill dielectric layer at an interface between a cell region and a logic region;
    an inter-metal dielectric (IMD) layer on the conductive cap layer; and
    a metal interconnection in the IMD layer and electrically connected to the top electrode through the conductive cap layer.

2. The semiconductor device according to claim 1, wherein the storage element comprises a magnetic tunnel junction (MTJ) under the top electrode.

3. The semiconductor device according to claim 2, wherein the MTJ comprises a magnetic reference layer on a bottom electrode layer, a tunnel barrier layer on the magnetic reference layer, a magnetic free layer on the tunnel barrier layer, and a capping layer on the magnetic free layer.

4. The semiconductor device according to claim 1, wherein the top electrode comprises tantalum.

5. The semiconductor device according to claim 1, wherein the spacer is in direct contact with a sidewall of the top electrode.

6. The semiconductor device according to claim 1, wherein the spacer comprises silicon nitride.

7. The semiconductor device according to claim 1, wherein the gap-fill dielectric layer comprises a silicon oxide layer.

8. The semiconductor device according to claim 1, wherein the gap-fill dielectric layer comprises a recessed top surface that is lower than a bottom surface of the top electrode.

9. The semiconductor device according to claim 1, wherein the conductive cap layer comprises Ti, TiN, Ta or TaN.

10. The semiconductor device according to claim 1, wherein the conductive cap layer is in direct contact with the top electrode and the spacer.

11. The semiconductor device according to claim 1, wherein the metal interconnection comprises a copper damascene structure.

12. The semiconductor device according to claim 1, wherein the metal interconnection comprises a downward tooth around the top electrode and the spacer.

* * * * *